(12) United States Patent
Tachibana et al.

(10) Patent No.: US 7,650,982 B2
(45) Date of Patent: Jan. 26, 2010

(54) PRODUCTION SYSTEM

(75) Inventors: Katsuyoshi Tachibana, Tokyo (JP);
Ryosei Sekiguchi, Tokyo (JP)

(73) Assignee: Hirata Corporation, Tokyo (JP)

( * ) Notice: Subject to any disclaimer, the term of this patent is extended or adjusted under 35 U.S.C. 154(b) by 193 days.

(21) Appl. No.: 11/579,136

(22) PCT Filed: Aug. 6, 2004

(86) PCT No.: PCT/JP2004/011660

§ 371 (c)(1),
(2), (4) Date: Oct. 31, 2006

(87) PCT Pub. No.: WO2006/013644

PCT Pub. Date: Sep. 2, 2006

(65) Prior Publication Data

US 2007/0215435 A1   Sep. 20, 2007

(51) Int. Cl.
*B65G 43/00* (2006.01)
(52) U.S. Cl. .............................. 198/341.01; 198/339.1; 700/230
(58) Field of Classification Search ............ 198/341.01, 198/339.1, 346–346.2, 347.1–347.4, 341.08, 198/570–572, 575, 358; 414/222.07; 700/230
See application file for complete search history.

(56) References Cited

U.S. PATENT DOCUMENTS

| | | | | |
|---|---|---|---|---|
| 1,408,047 A * | 2/1922 | Upp | ........................... | 29/791 |
| 3,522,942 A * | 8/1970 | Hepp | ........................ | 198/346 |
| 3,796,327 A * | 3/1974 | Meyer et al. | ........... | 414/222.02 |
| 3,889,797 A * | 6/1975 | Naito et al. | ............. | 198/346.1 |
| 3,909,922 A * | 10/1975 | Takasaki et al. | .............. | 29/563 |
| 4,069,764 A * | 1/1978 | Teyssedre | ............... | 198/339.1 |
| 4,237,598 A * | 12/1980 | Williamson | ..................... | 483/4 |
| 4,538,950 A * | 9/1985 | Shiomi et al. | .......... | 414/222.06 |
| 4,703,558 A * | 11/1987 | Makinen | ..................... | 198/346 |
| 4,719,694 A * | 1/1988 | Herberich et al. | ...... | 198/341.03 |
| 4,722,653 A * | 2/1988 | Williams et al. | ........ | 414/222.13 |
| 4,783,904 A * | 11/1988 | Kimura | ........................ | 29/786 |
| 4,884,330 A * | 12/1989 | Sticht | .......................... | 29/430 |
| 4,894,908 A * | 1/1990 | Haba et al. | .................... | 29/711 |
| 5,103,963 A * | 4/1992 | Sticht | ...................... | 198/465.1 |
| 5,205,026 A * | 4/1993 | Sticht | ...................... | 198/346.1 |

(Continued)

FOREIGN PATENT DOCUMENTS

JP           3-259812           11/1991

(Continued)

*Primary Examiner*—Gene Crawford
*Assistant Examiner*—William R Harp
(74) *Attorney, Agent, or Firm*—Wenderoth, Lind & Ponack, L.L.P.

(57) ABSTRACT

A production system that includes a single main conveying line capable of defining a plurality of manual work areas and capable of conveying workpieces, a shuttle that holds a workpiece thereon and that reciprocates along the main conveying line, a shuttle conveying line on which the shuttle is reciprocated over a predetermined distance, a plurality of automatic processing machines that are disposed along the shuttle conveying line on the side opposite to the side on which the main conveying line is laid and that automatically apply a variety of process operations to the workpiece, and a plurality of display units that are disposed adjacent to the manual work areas and that display information about process operations to be applied to the workpiece.

11 Claims, 11 Drawing Sheets

U.S. PATENT DOCUMENTS

| | | | | |
|---|---|---|---|---|
| 5,271,139 A * | 12/1993 | Sticht | | 198/346.1 |
| 5,271,490 A * | 12/1993 | Sticht | | 198/349 |
| 5,353,495 A * | 10/1994 | Terabayashi et al. | | 198/346.2 |
| 5,374,231 A * | 12/1994 | Obrist | | 483/15 |
| 5,771,554 A * | 6/1998 | Komiya | | 29/430 |
| 5,873,449 A * | 2/1999 | Davenport | | 198/370.09 |
| 5,884,746 A * | 3/1999 | Leisner et al. | | 198/346.1 |
| 5,937,994 A * | 8/1999 | de Barbuat | | 198/346.2 |
| 5,988,857 A * | 11/1999 | Ozawa et al. | | 700/213 |
| 6,089,811 A * | 7/2000 | Watanabe et al. | | 414/269 |
| 6,188,402 B1 * | 2/2001 | Csipkes et al. | | 715/705 |
| 6,224,385 B1 * | 5/2001 | Nitta et al. | | 434/219 |
| 6,336,546 B1 * | 1/2002 | Lorenz | | 198/346.2 |
| 6,345,207 B1 * | 2/2002 | Nitta et al. | | 700/83 |
| 6,353,986 B1 * | 3/2002 | Becherucci et al. | | 29/401.1 |
| 6,516,239 B1 * | 2/2003 | Madden et al. | | 700/115 |
| 6,519,837 B1 * | 2/2003 | Ichikawa et al. | | 29/720 |
| 6,520,312 B2 * | 2/2003 | Jager | | 198/346.1 |
| 6,591,488 B1 * | 7/2003 | Tachibana | | 29/783 |
| 6,591,961 B2 * | 7/2003 | Fukushima | | 198/346.2 |
| 6,654,663 B1 * | 11/2003 | Jokela | | 700/230 |
| 6,670,568 B2 * | 12/2003 | Goetzke | | 209/567 |
| 6,799,521 B2 * | 10/2004 | Tai et al. | | 104/88.01 |
| 6,804,880 B2 * | 10/2004 | Yamamoto | | 29/700 |
| 6,886,241 B2 * | 5/2005 | Tachibana et al. | | 29/791 |
| 6,931,303 B2 * | 8/2005 | Chang et al. | | 700/228 |
| 7,168,548 B2 * | 1/2007 | Naumann et al. | | 198/346.2 |
| 7,331,439 B2 * | 2/2008 | Degain et al. | | 198/339.1 |
| 2002/0033319 A1 * | 3/2002 | Fukushima | | 198/570 |
| 2002/0046918 A1 * | 4/2002 | Yamazaki et al. | | 198/339.1 |
| 2005/0087426 A1 * | 4/2005 | Fenzl et al. | | 198/346.2 |

FOREIGN PATENT DOCUMENTS

| | | |
|---|---|---|
| JP | 5-50366 | 3/1993 |
| JP | 5-57574 | 3/1993 |
| JP | 2001-18869 | 1/2001 |

* cited by examiner

PRODUCTION SYSTEM

BACKGROUND OF THE INVENTION

1. Field of the Invention

The present invention relates to an article production system in which automated process operations performed by a plurality of automatic processing machines and manual process operations performed by a plurality of workers are mixed together, and, more particularly, to a production system including shuttles that convey workpieces while reciprocating at high speed.

2. Description of the Related Art

A conventional production system that manufactures vehicle engines or the like is shown in FIG. 1. In this production system, a plurality of automatic processing machines 2 that apply various process steps, such as machining, attachment of parts, screw loosening, and screw tightening, onto workpieces W, such as engine cylinder blocks or engine cylinder heads, are arranged along a conveying line 1 that conveys workpieces W. Manual work areas 3 in which workers M can perform various process operations by manual work are located between the automatic processing machines 2.

In this production system, since the automated process steps and the manual process steps are performed in series with each other, the absence of any one of these process steps causes a stoppage in the flow of the whole of the system, and, since the system has an arrangement structure in which the manual work area 3 (i.e., the manual process step) is located between the automatic processing machines 2, one worker M has difficulty in performing a plurality of manual process operations across the automatic processing machine 2. Therefore, a conventional problem resides in the fact that it is difficult to efficiently station the workers M, for example, when a production adjustment is required to be carried out in response to a demand drop in the market.

Additionally, in one conveying line, workpieces W being conveyed on the upstream side of the flow line must be held until all process operations to be performed by the automatic processing machine 2 are completed if the automatic processing machine 2 has a plurality of processing functions. Additionally, when the automatic processing machine 2 is replaced in accordance with a change in specifications of the workpiece W or a change in the machine model, all conveying lines must be stopped. Therefore, another conventional problem resides in the fact that it is not easy to increase the amount of production in response to a demand rise in the market, and that it is not easy to change the automatic processing machine 2 or add a new machine so as to be suited to workpieces W.

On the other hand, a production system capable of increasing and decreasing the number of pieces of equipment in accordance with an increase and decrease in the amount of production is known. This production system includes one conveying line having shuttles that convey workpieces, an automatic processing machine that is disposed on one side of the conveying line and that automatically performs a plurality of process operations, and a plurality of manual work stands that are disposed on the opposite side of the conveying line and in which workers perform various process operations by hand (see Japanese Unexamined Patent Publication No. 2001-18869, for example).

However, in this production system, the manual work stands are disposed adjacent to each other on the same side. Therefore, there is a fear that a worker will handle a workpiece conveyed to a manual work stand by a shuttle without following a correct procedure (for example, a process step may be performed prior to the proper time, or a worker in charge of a manual work area will perform a series of process operations in improper order). Additionally, workpieces are all transferred by shuttles between the automatic processing machine and the manual work stand and between the two manual work stands. Therefore, it is difficult to, for example, smoothly convey a workpiece, which has undergone faulty processing, to a manual work stand located on the upstream side in order to apply an alteration to this workpiece, and hence it is impossible to smoothly apply all of the process steps to the workpiece.

SUMMARY OF THE INVENTION

The present invention has been made in consideration of the circumstances of the conventional systems. It is therefore an object of the present invention to provide a production system for producing motor vehicles, electric equipment, or their components that mixes automated process steps and manual process steps together. In this production system, a worker can be prevented from performing an improper operation, and the process steps of the whole of the system can be smoothly performed. Additionally, in this production system, the number of pieces of equipment can be easily increased and decreased in accordance with an increase and decrease in the amount of production, or the equipment can be easily replaced in accordance with a change in machine model.

A production system of the present invention that achieves the above-mentioned object includes a main conveying line capable of defining a plurality of manual work areas and capable of conveying workpieces, a shuttle conveying line laid over a predetermined distance along the main conveying line, a shuttle that holds a workpiece thereon and that reciprocates on the shuttle conveying line, a plurality of automatic processing machines that are disposed along the shuttle conveying line and that automatically apply a variety of process operations to the workpiece, and a display unit that is disposed adjacent to the manual work area and that displays information about a process operation to be applied to the workpiece.

According to this structure, a workpiece conveyed from the upstream side of the main conveying line is automatically or manually transferred to a shuttle, and is conveyed to a predetermined automatic processing machine by allowing the shuttle to move on the shuttle conveying line. When the automatic processing machine completes an automated process operation, the workpiece is again placed on the shuttle, and is transferred to a manual work area on the main conveying line. In this manual work area, a worker applies a predetermined manual process operation to the workpiece while confirming process information displayed by the display unit. Thereafter, the workpiece is again placed on the shuttle, and is conveyed by the shuttle to the same or another automatic processing machine. The automatic processing machine performs and completes another automated process operation. The workpiece is again placed on the shuttle, and is transferred to another manual work area on the main conveying line. Thus, a series of manual process operations and automated process operations can be performed correlatively and smoothly, and productivity can be raised. Especially, the display unit enables the worker to obtain process information. Therefore, the process operations can be monitored so that the entire system process can be performed reliably and smoothly, and, in addition, a process operation assigned to the worker can be performed while confirming the work sequence.

Additionally, since the shuttle and the shuttle conveying line are disposed adjacent to the main conveying line by which a plurality of manual work areas can be defined, and since a plurality of automatic processing machines are disposed adjacent to the shuttle conveying line whereby the shuttle conveying line is located between the automatic processing machines and the main conveying line, an increase or decrease in the number of workers and in the number of the automatic processing machines or the replacement of the equipment can be easily achieved in response to an increase or decrease in the amount of production or a change in the machine model.

Preferably, in the structure mentioned above, the display unit may be disposed with respect to each of the manual work areas.

According to this structure, since the display unit is provided for each manual work area, a worker in charge of each manual work area can ascertain and obtain only process information concerning the manual work area assigned to the worker (for example, the contents of the last process operation performed by the automatic processing machine, the contents of the last manual process operation, or the contents of a manual process operation to be performed in the manual work area assigned to the worker). Therefore, the worker can confirm not only information concerning the other manual work areas, but also information necessary in the manual work area assigned to the worker, and hence can be reliably prevented from applying a wrong process operation to a workpiece, without being deluded by information not directly linked thereto.

Preferably, in the structure mentioned above, the display unit may display information about a manual process operation that is applied to a workpiece.

According to this structure, a worker in charge of each manual work area can confirm the contents of a manual process operation in the manual work area assigned to the worker, and hence can correctly perform the predetermined manual process operation. Therefore, even when a manual work area is assigned to a worker inexperienced in this manual work area, the worker can perform a process operation while confirming the contents of this process operation on the display unit.

Preferably, in the structure mentioned above, when a faulty manual process operation is applied to a workpiece, the display unit may display information showing this faulty manual process operation.

According to this structure, when a faulty manual process operation is applied to a workpiece, the display unit informs the worker of this, and hence the worker can immediately take the suitable countermeasures.

Preferably, in the structure mentioned above, a connection conveying line that is a connection formed between the main conveying line and the shuttle conveying line and that conveys a workpiece may be provided in an area corresponding to each of the automatic processing machines.

According to this structure, since the connection conveying line transfers a workpiece between the main conveying line and the shuttle, the workpiece can be conveyed more smoothly between the manual work area and the automatic processing machine.

Preferably, in the structure mentioned above, the connection conveying line may include a connection carry-out line extending from the main conveying line toward the shuttle conveying line and a connection carry-in line extending from the shuttle conveying line toward the main conveying line.

According to this structure, the connection carry-out line performs a carry-out operation of a workpiece when this workpiece is carried out from the manual work area toward the shuttle (or toward the automatic processing machine). On the other hand, the connection carry-in line performs a carry-in operation of a workpiece when this workpiece is carried in from the shuttle (or from the automatic processing machine) toward the manual work area. Therefore, the pre-provision of a plurality of shuttles makes it possible to simultaneously perform a carry-out operation and a carry-in operation of a workpiece between the manual work area and the shuttle (or the automatic processing machine), thus making it possible to smooth the flow of workpieces.

Preferably, in the structure mentioned above, the production system may further include a control means for controlling workpiece processing, and, when a faulty manual process operation is applied to a workpiece, the control means drive-controls the connection conveying line and the shuttle so as to return the workpiece to a corresponding manual work area.

According to this structure, for example, a workpiece that has undergone a faulty process operation at the preceding step is again returned to a corresponding manual work area located on the upstream side via the connection conveying line and the shuttle. Therefore, an altering operation can be smoothly performed in the series of process steps.

Preferably, in the structure mentioned above, the automatic processing machines and the shuttle conveying line may form a related automatic processing station, whereas the manual work areas and the display unit may form a related manual workstation, and the automatic processing station and the manual work station may be disposed at a plurality of places along the main conveying line.

According to this structure, since the automatic processing stations and the manual work stations are arranged along the single main conveying line, workpieces can be conveyed on the main conveying line, and mutually-related process operations can be performed in each of the automatic processing stations and the manual work stations, thus making it possible to smoothly perform the series of process steps and to raise productivity.

Preferably, in the structure mentioned above, the shuttle conveying lines included in the automatic processing stations disposed at the plurality of places may be connected to each other.

According to this structure, when a workpiece is transferred between the automatic processing station located on the upstream side and the automatic processing station located on the downstream side, the workpiece can be transferred not only by using the main conveying line, but also by using the shuttle conveying line (i.e., shuttle). Therefore, the workpiece can be more smoothly conveyed.

Preferably, in the structure mentioned above, the display unit may be hung from a guide member provided along and above the main conveying line so that the display unit is hung so as to be freely moved and fixed with respect to the guide member.

According to this structure, since the display unit is hung above the main conveying line, i.e., above the manual work area without being placed on, for example, the ground surface, a worker can freely move so as to raise working efficiency without being subjected to restrictions on mobility that are caused by the display unit.

Preferably, in the structure mentioned above, the automatic processing machine may include an assembling mechanism capable of automatically applying at least one assembly process operation selected from a part attaching operation, a part detaching operation, a screw tightening operation, and a screw loosening operation onto an engine cylinder block or an engine cylinder head.

According to this structure, in the production system that automatically performs an engine assembly operation, productivity can be raised, and an increase or decrease in the number of pieces of equipment or the replacement of the equipment with another can be easily achieved in response to an increase or decrease in the amount of production of engines or a change in the machine model.

DETAILED DESCRIPTION OF THE INVENTION

Preferred embodiments of the present invention will be hereinafter described with reference to the accompanying drawings.

Figure 1:
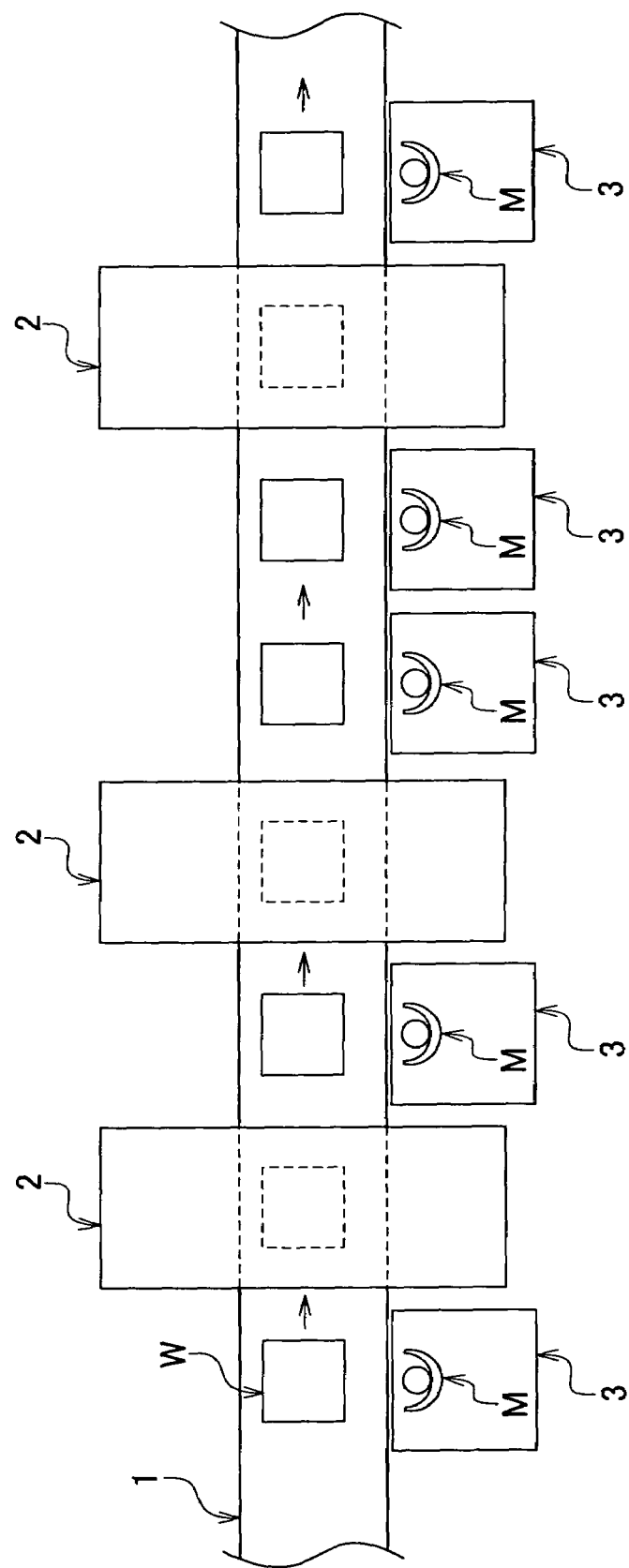
FIG. 1 is a plan view showing a conventional production system.
Figure 2:
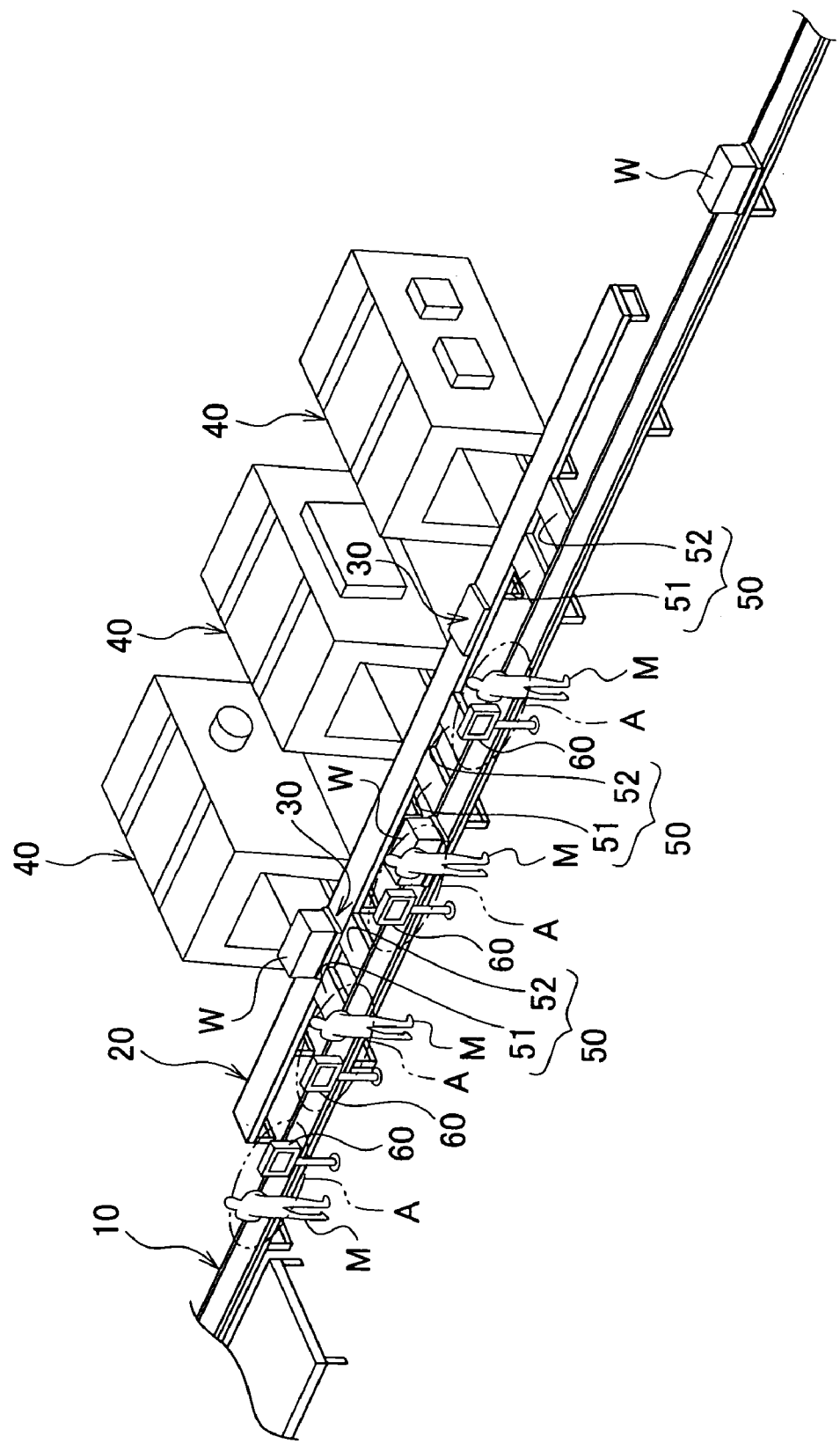
FIG. 2 is a perspective view showing a first embodiment of a production system according to the present invention.
Figure 3:
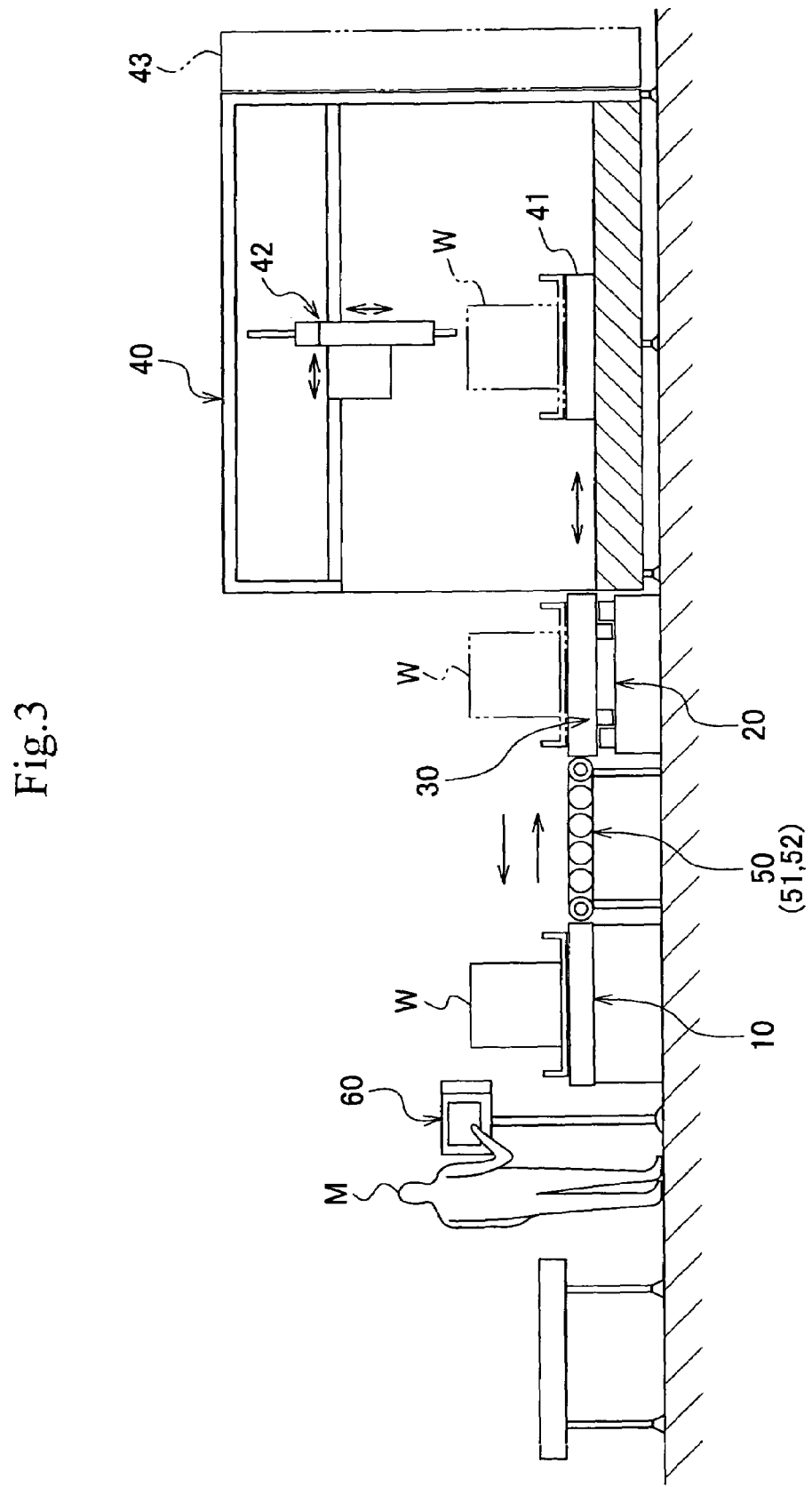
FIG. 3 is a cross-sectional view showing a part of the production system shown in FIG. 2.
Figure 4:
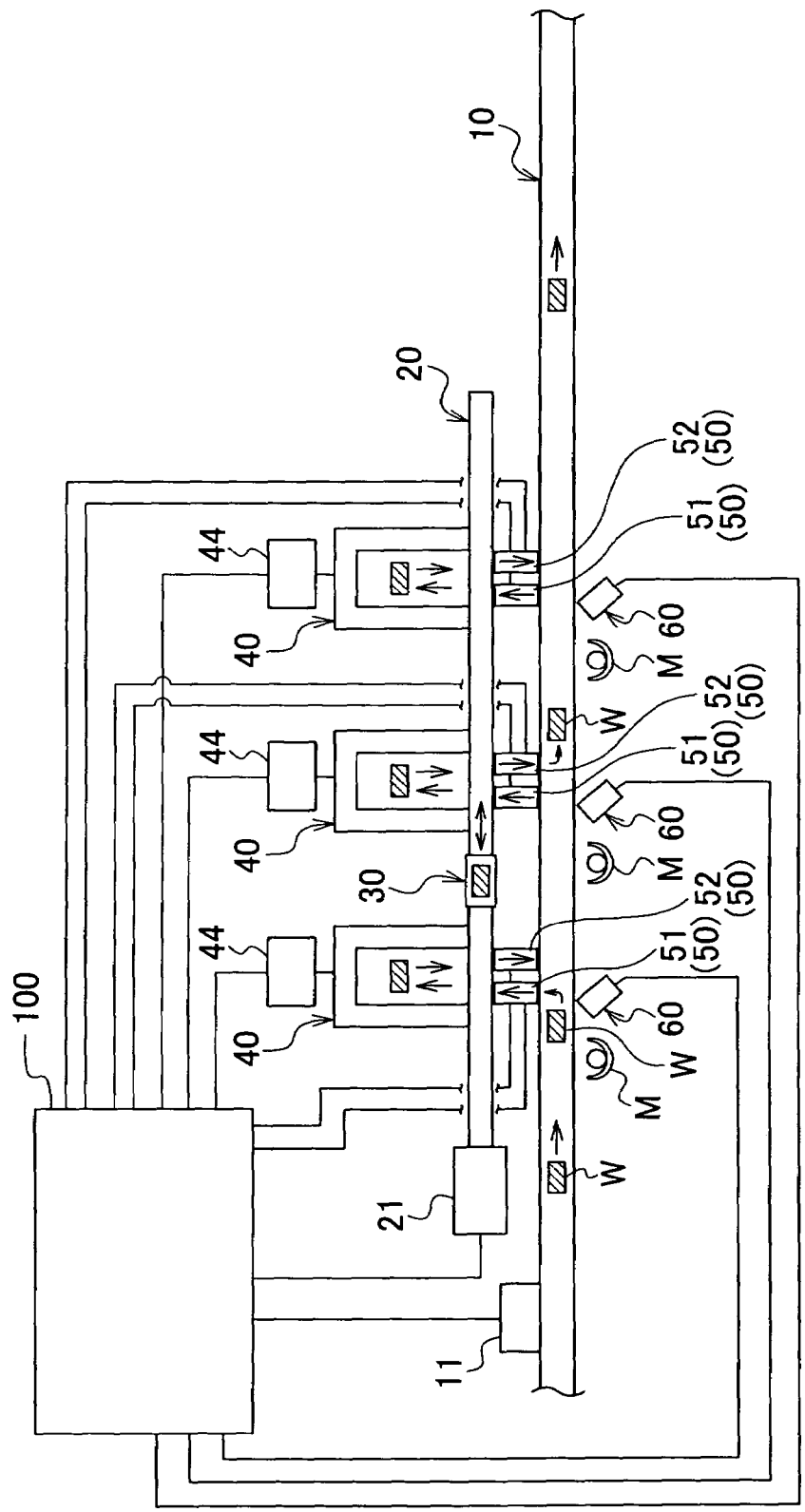
FIG. 4 is a block diagram of a control system of the production system shown in FIG. 2.

As shown in FIG. 2 to FIG. 4, a first embodiment of the production system includes a main conveying line 10 that can define a plurality of manual work areas A and that can convey workpieces W, a shuttle conveying line 20 laid over a predetermined distance along the main conveying line 10, a shuttle 30 that carries a workpiece W thereon and that reciprocates on the shuttle conveying line 20, a plurality of automatic processing machines 40 that are disposed along the shuttle conveying line 20 and that automatically apply various process operations to workpieces W, a connection conveying line 50 that conveys workpieces W while serving as a connection between the main conveying line 10 and the shuttle conveying line 20, a display unit 60 that is disposed adjacent to the manual work area A and that displays information concerning the processing of workpieces W, and a host computer 100 serving as a control means for controlling the entire system.

In this embodiment, an engine cylinder block, an engine cylinder head, or its related component, which is mounted on, for example, a vehicle, is used as a workpiece W to be processed.

As shown in FIG. 2 to FIG. 4, the main conveying line 10 can convey workpieces W received automatically by use of transfer equipment, or manually from the upstream side in the system flow toward the downstream side, and defines a plurality of manual work areas A in each of which a worker M performs manual process operations assigned to the worker M. Accordingly, the worker M can stand adjacent to the main conveying line 10 on one side of the main conveying line 10. Each of the manual work areas A is located so as to correspond to each of the automatic processing machines 40 described later (i.e., is located to face each of them).

The main conveying line 10 is a roller type conveyer, and is provided with a stop mechanism that stops a workpiece W in a manual work area A. The main conveying line 10 is additionally provided with a driving mechanism 11 that automatically conveys a workpiece W between the manual work areas A. The driving mechanism 11 is connected to the host computer 100, and is drive-controlled thereby.

The main conveying line 10 may have only a plurality of rollers, and a worker M may push a workpiece W on the rollers to convey this.

As shown in FIG. 2 to FIG. 4, the shuttle conveying line 20 is laid over a predetermined distance along the main conveying line 10 on the side opposite to the side on which a worker M stands. The shuttle conveying line 20 has a driving mechanism 21 that reciprocatively guides a shuttle 30 capable of holding a workpiece W thereon at high speed. The driving mechanism 21 is connected to the host computer 100, and is drive-controlled thereby.

A driving mechanism by linear motors, a driving mechanism by super high-speed ball screws, a driving mechanism by belts, a driving mechanism by gears, or other types of driving mechanisms can be employed as the driving mechanism 21 that reciprocates a shuttle 30 at high speed.

The shuttle 30 may have a mechanism that assists the carry-in operation of a workpiece W when the workpiece W is held and a mechanism that assists the carry-out operation of a workpiece W when the workpiece W is transferred. A plurality of shuttles 30 may be provided on the single shuttle conveying line 20 so that each of the shuttles 30 is drive-controlled to be freely reciprocated.

As shown in FIG. 2 to FIG. 4, in order to transfer a workpiece W between the manual work area A and the shuttle 30, the connection conveying line 50 is located between the main conveying line 10 and the shuttle conveying line 20 at a place corresponding to each of the automatic processing machines 40.

The connection conveying line 50 is made up of a connection carry-out line 51 that carries a workpiece W out from the main conveying line 10 toward the shuttle conveying line 20 and a connection carry-in line 52 that carries a workpiece W in from the shuttle conveying line 20 toward the main conveying line 10.

In detail, the connection carry-out line 51 performs a carry-out operation of a workpiece W when this workpiece W is carried out from the manual work area A toward the shuttle 30 (or toward the automatic processing machine 40). On the other hand, the connection carry-in line 52 performs a carry-in operation of a workpiece W when this workpiece W is carried in from the shuttle 30 (or from the automatic processing machine 40) toward the manual work area A. Therefore, the pre-provision of a plurality of shuttles 30 makes it possible to simultaneously perform a carry-out operation and a carry-in operation of a workpiece W between the manual work area A and the shuttle 30 (or the automatic processing machine 40), thus smoothing the flow of workpieces W.

As shown in FIG. 2 to FIG. 4, a plurality of automatic processing machines 40 are disposed along the shuttle conveying line 20, and serve to automatically apply various process operations to workpieces W transferred from the shuttle 30. In this embodiment, the automatic processing machines 40 arranged adjacent to the shuttle conveying line 20 that is used for each of the automatic processing machines 40 serve to apply a series of mutually-related process operations to workpieces W.

As shown in FIG. 3, the automatic processing machine 40 includes a movable table 41 that moves a workpiece W transferred from the shuttle 30 while holding the workpiece W thereon, an operation unit 42 that applies a variety of automated process operations to workpieces W, a component storage container 43 that stores components when necessary, and an articulated robot (not shown) that transports components from the component storage container 43 to a workpiece W. As shown in FIG. 4, the automatic processing machine 40 is connected to a sub-computer 44 that controls the driving of the movable table 41 and each process operation. The sub-computer 44 is connected to the host computer 100 so that the entire sequence can be controlled.

The movable table 41 receives a workpiece W from the shuttle 30, then brings in the workpiece W so as to occupy a predetermined processing position, and positions the workpiece W. After completing a predetermined process operation, the movable table 41 again transfers the workpiece W toward the shuttle 30.

The operation unit 42 applies a predetermined automated process operation to a workpiece W, depending on this workpiece W. If this workpiece W is an engine cylinder block, the operation unit 42 may include an assembling mechanism that performs at least one assembling process operation, such as machining, the attachment and detachment of components, screw loosening, or screw tightening.

For example, to fit a crankshaft and a metal into the cylinder block, the automatic processing machines 40 can include an automatic processing machine 40 that performs the screw loosening of a main cap which is an automated process operation, an automatic processing machine 40 that performs the detachment of, for example, the main cap (i.e., disengagement thereof from a fitted state) and the attachment of the main cap (i.e., fitting) which is an automated process operation, and an automatic processing machine 40 that performs the screw tightening of the main cap which is an automated process operation.

In other words, a variety of mutually-related process operations (i.e., automated process operations and manual process operations) can be performed at high efficiency by the automatic processing machines 40 arranged along the single shuttle conveying line 20, by the manual work areas A each of which is located in an area corresponding to each of the automatic processing machines 40, and by the shuttle 30 that conveys a workpiece W between the automatic processing machine 40 and the manual work area A.

As shown in FIG. 2 to FIG. 4, the display unit 60 is disposed adjacent to the main conveying line 10 in each of the manual work areas A, and is connected to the host computer 100. The display unit 60 is made up of a monitor, such as a liquid crystal monitor or a cathode-ray tube monitor, an operating button that can be operated by a worker M, etc.

For example, the switching of the operating button allows the display unit 60 to visually display information about manual process operations in a corresponding manual work area A (for example, a processing procedure), information about manual process operations in a desired manual work area A, or information about automated process operations by the automatic processing machine 40 in the form of letters or a three-dimensional animation.

Since the display unit 60 is provided in each of the manual work areas A, a worker M in charge of one of the manual work areas A can obtain, for example, the contents of the last process operation performed by the automatic processing machine 40, the contents of the last manual process operation in that manual work area A, or the contents of a manual process operation to be performed in the manual work area A assigned to the worker M. Therefore, the worker M can obtain necessary information in the manual work area A assigned to the worker M while confirming the process operations concerning the other manual work areas A, and hence faulty process operations can be reliably prevented from being performed.

Since a worker M in charge of one of the manual work areas A can confirm the contents of a manual process operation in that manual work area A especially by displaying information about the manual process operation to be applied to a workpiece W on the display unit 60, the worker M can correctly perform the predetermined manual process operation. Therefore, even when a manual work area A is assigned to a worker M inexperienced in this manual work area A, the worker M can perform a process operation while confirming the contents of this process operation on the display unit 60.

If the display unit 60 is enabled to display the information that a faulty manual process operation has been applied to a workpiece W, a worker M can immediately take the most suitable countermeasures when the worker M is informed of the faulty manual process operation. For example, when a faulty process operation was performed in a manual work area A preceding the manual work area A assigned to the worker M, the worker M in charge of the manual work area A subsequent thereto can issue an alteration command while manipulating the operating button of the display unit 60, and can issue a control command to return the workpiece to the preceding manual work area A where the workpiece W undergoes a necessary alteration. Therefore, in the manual work area A where the workpiece W is required to undergo a necessary alteration, the information of "Alteration Required" is displayed by the display unit 60, thus making it possible to apply a necessary alteration to the workpiece W returned thereto.

Figure 5:
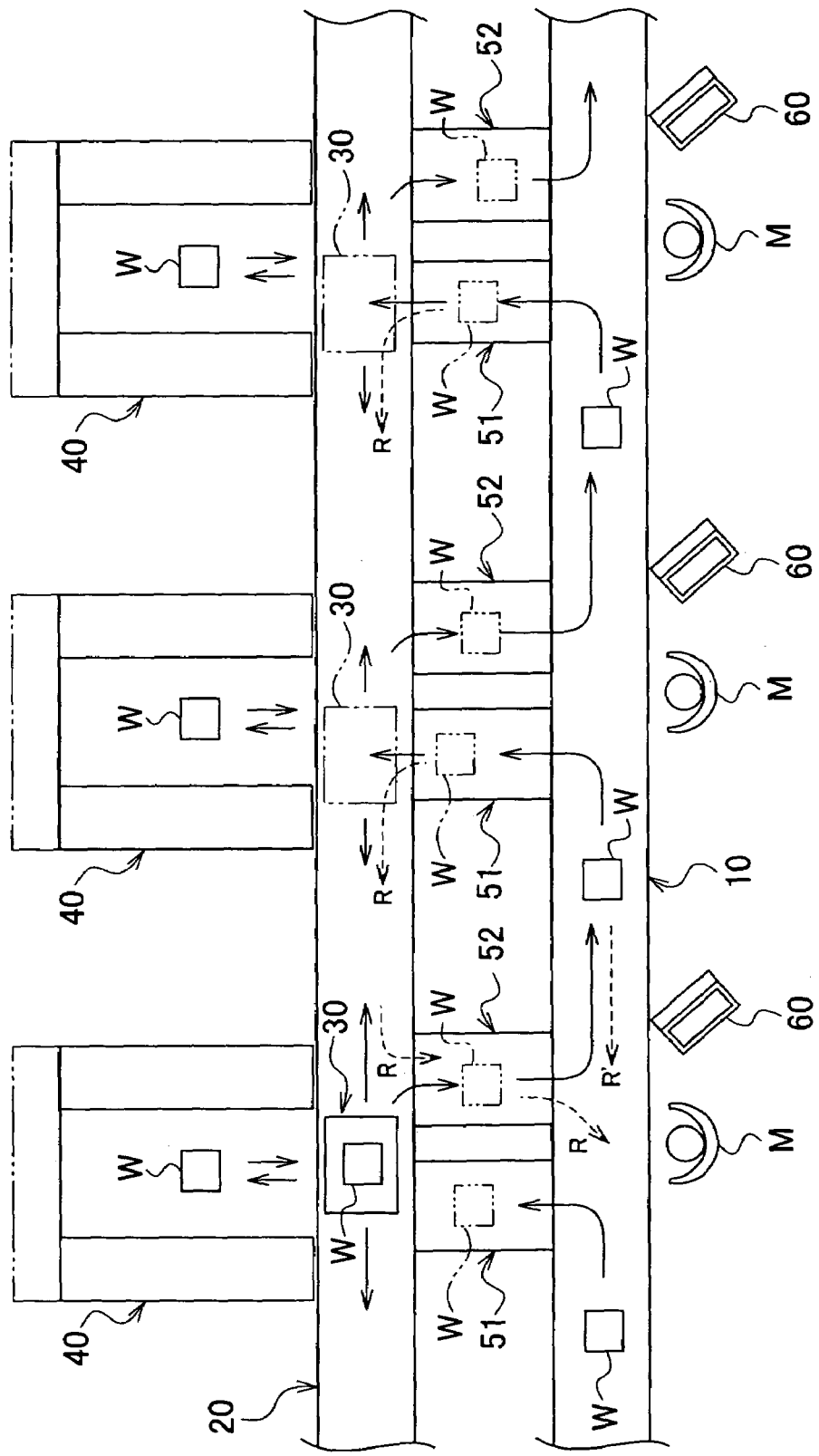
FIG. 5 is a plan view showing the flow of workpieces in the production system shown in FIG. 2.

FIG. 5 shows a system flow followed when manual process operations, automated process operations, and alteration process operations are applied to workpieces W in the production system described above.

In detail, when a workpiece W conveyed from the upstream side of the main conveying line 10 reaches a first manual work area A, a worker M performs a predetermined manual process operation while confirming the contents of the process operation, a work sequence, etc., on the display unit 60.

Thereafter, the workpiece W that has undergone the manual process operation is transferred to a shuttle 30 via a first connection carry-out line 51. The shuttle 30 then conveys the workpiece W to a first automatic processing machine 40.

When a variety of automated process operations are completed by this automatic processing machine 40, the shuttle 30 receives and transfers the workpiece W to the main conveying line 10 via a first connection carry-in line 52. The workpiece W is then conveyed to a second manual work area A.

Thereafter, a worker M in charge of the second manual work area A performs a predetermined manual process operation while confirming the contents of the process operation, a work sequence, etc., on the display unit 60. Herein, from the information shown by the display unit 60, the worker M can also confirm whether the preceding manual process operation has been correctly performed. If a faulty process operation has been applied to the workpiece W, an alteration command signal is input into the display unit 60, and allows the host computer 100 to drive-control the connection carry-out line 51 and the shuttle 30 so as to again return the workpiece W to the previous manual work area A. As a result, the workpiece W is again returned to the previous manual work area A via the connection carry-out line 51 and the shuttle 30 as shown by the dotted line R of FIG. 5. The worker M may pass the workpiece W directly to the previous manual work area A via the main conveying line 10 as shown by the dotted line R' of FIG. 5.

Since the display unit 60 is informed of the manual work area A in which a faulty process operation has been performed, the worker M can apply a necessary alteration to the workpiece W returned thereto.

On the other hand, when the workpiece W that has undergone a proper process operation reaches the second manual work area A, the worker M applies a predetermined manual process operation to the workpiece W while confirming the contents of the process operation, a work sequence, etc., on the display unit 60.

Thereafter, the workpiece W that has undergone the manual process operation is transferred to the shuttle 30 via a second connection carry-out line 51. The shuttle 30 then conveys the workpiece W toward a second automatic processing machine 40 (or toward the first automatic processing machine 40 if an automated process operation is performed by the first automatic processing machine 40).

After a variety of automated process operations are performed by this automatic processing machine 40, the shuttle 30 receives and transfers the workpiece W to the main conveying line 10 via a second connection carry-in line 52. The workpiece W is then conveyed to a third manual work area A.

In the third manual work area A, manual process operations are performed in the same way as above, and a series of mutually-related process operations are completed.

When the series of process operations are completed, the workpiece W is conveyed on the main conveying line 10 toward its downstream side. For example, when another related process operation is applied to the workpiece W, the workpiece W is conveyed to another manual work area A and to another automatic processing machine 40 that are located on the downstream side of the main conveying line 10.

A series of manual process operations and automated process operations can be performed correlatively and smoothly in this way, and productivity can be raised. Especially, the display unit 60 enables the worker to obtain information concerning the process operations. Therefore, the process operations can be monitored so that the entire process can be performed reliably and smoothly, and, in addition, a process operation assigned to the worker can be performed while confirming the work sequence.

Figure 6:
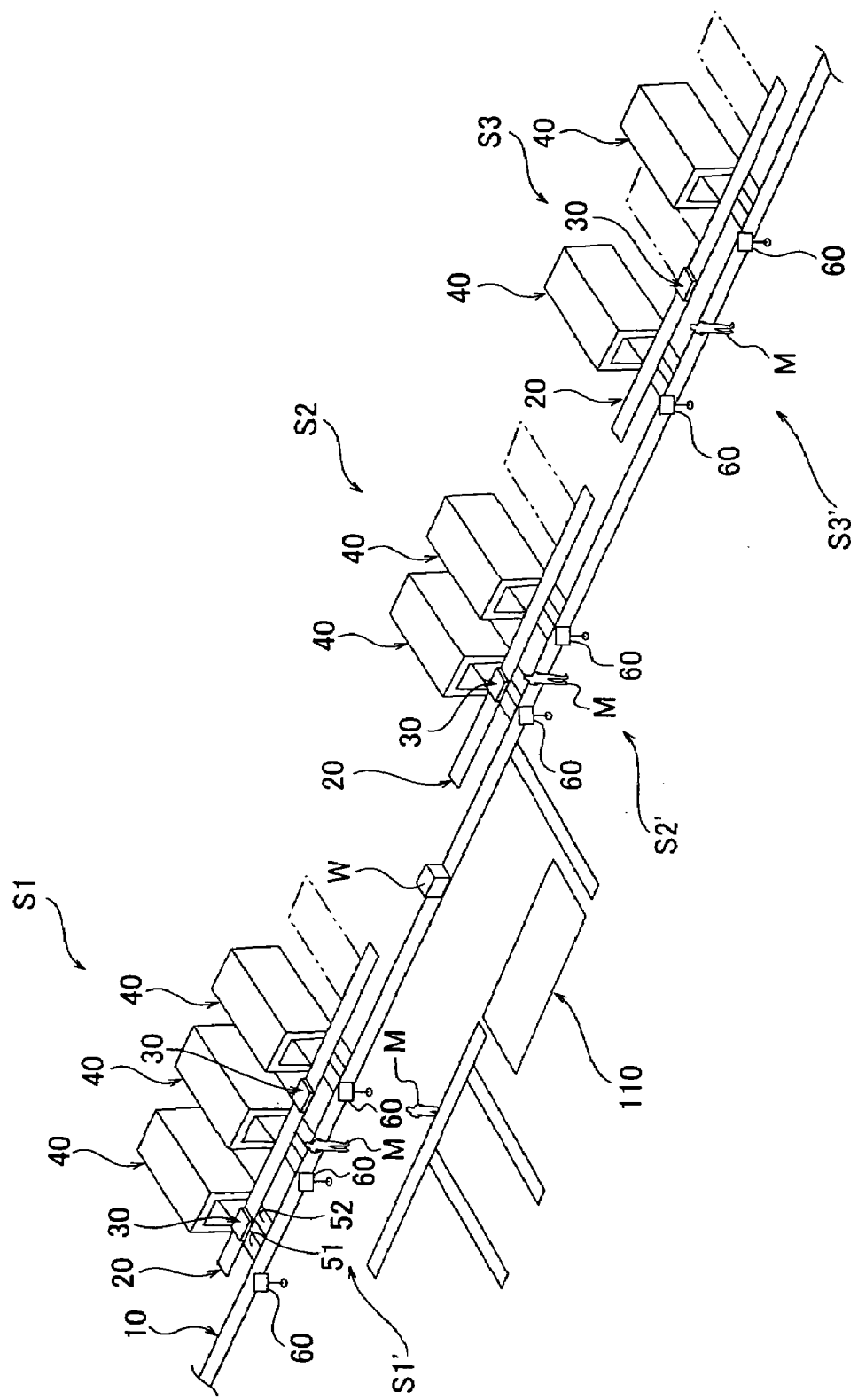
FIG. 6 is a perspective view showing a second embodiment of the production system according to the present invention.

FIG. 6 shows a second embodiment of the production system according to the present invention. The same reference characters are used to identify structure identical to the structure in the above embodiment, and a description of the same is omitted.

In detail, in this production system, a plurality of automatic processing stations S1, S2, and S3 and a plurality of manual work stations S1', S2', and S3' are arranged along one main conveying line 10 as shown in FIG. 6. A sub-station 110 used to perform an auxiliary manual process operation is located on the side on which a worker M for the main conveying line 10 is stationed.

The automatic processing stations S1, S2, and S3 are used to apply different automated process operations to workpieces W, and each station has a plurality of automatic processing machines 40, shuttles 30, and a shuttle conveying line 20.

The manual work stations S1', S2', and S3' are used to apply manual process operations, which are correlated with the automatic processing stations S1, S2, and S3, respectively, to workpieces W. Each of the manual work stations has a plurality of manual work areas A and display units 60.

In this production system, a worker M is stationed to concurrently have at least two manual work areas A. The reason is that the number of workers M is reduced, and workpieces W are conveyed in slow "takt time" when the amount of production is decreased.

Since the automatic processing stations S1, S2, and S3 and the manual work stations S1', S2', and S3' are arranged along the single main conveying line 10 as described above, workpieces W can be conveyed on the main conveying line 10, and a variety of mutually-related process operations (i.e., automated process operations and manual process operations) can be smoothly performed, thus making it possible to perform the series of process operations at high efficiency.

Additionally, since a worker M is stationed on one side of the single main conveying line 10, a plurality of manual work areas A can be easily assigned to one worker M, and workers M can be efficiently stationed, thus making it possible to reduce production costs while suppressing a rise in labor costs.

Figure 7:
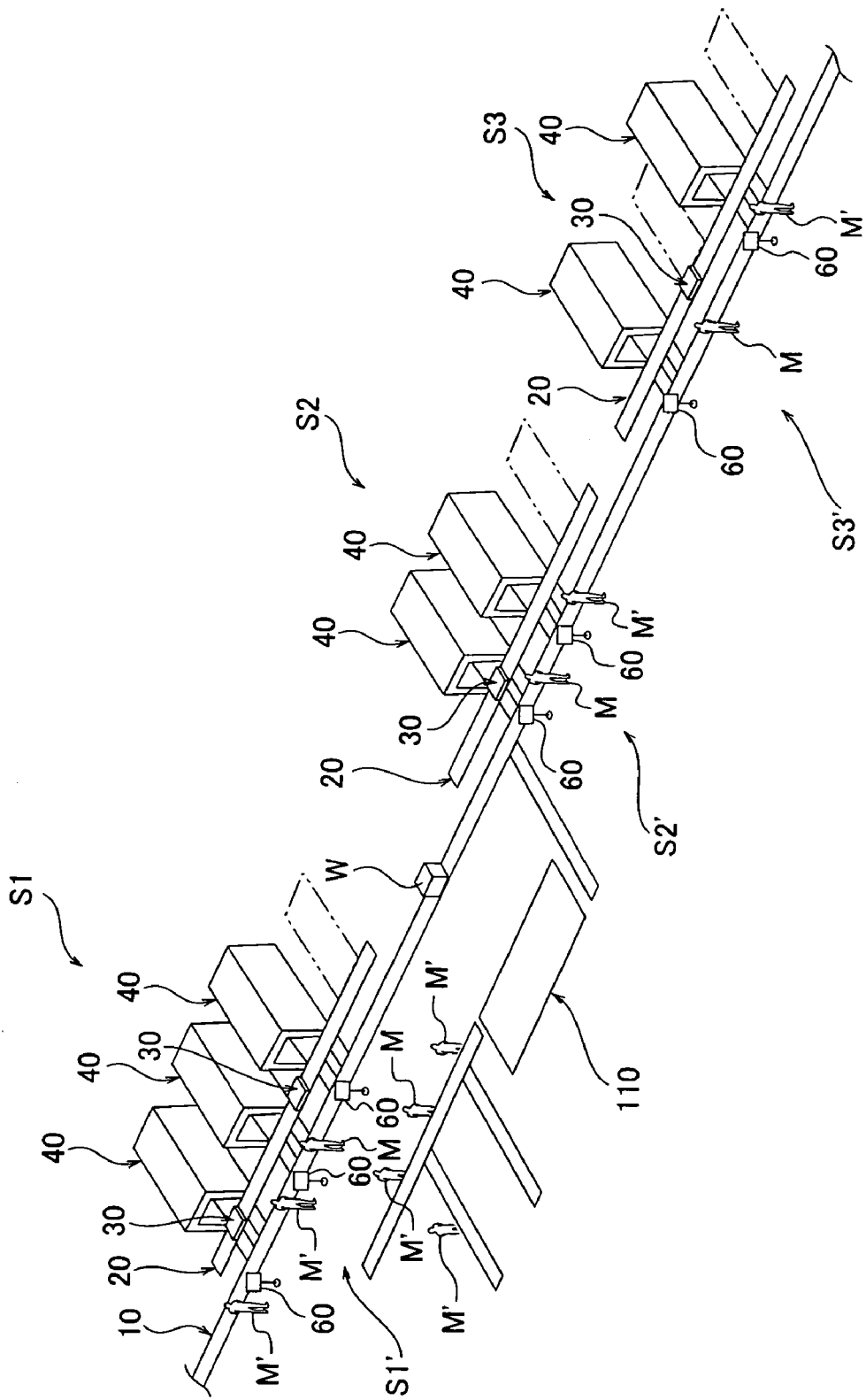
FIG. 7 is a perspective view showing a third embodiment of the production system according to the present invention.

FIG. 7 shows a third embodiment of the invention wherein the amount of production is increased as compared to the production system of FIG. 6.

To increase the amount of production, workers M' are additionally stationed in the manual work stations S1', S2', and S3' and in the sub-station 110 in an appropriate manner, and workpieces W are conveyed in fast "takt time."

Thus, workers M' can be additionally stationed along the main conveying line 10 with ease without changing the production system, and the amount of production can be increased in response to increasing demand.

Figure 8:
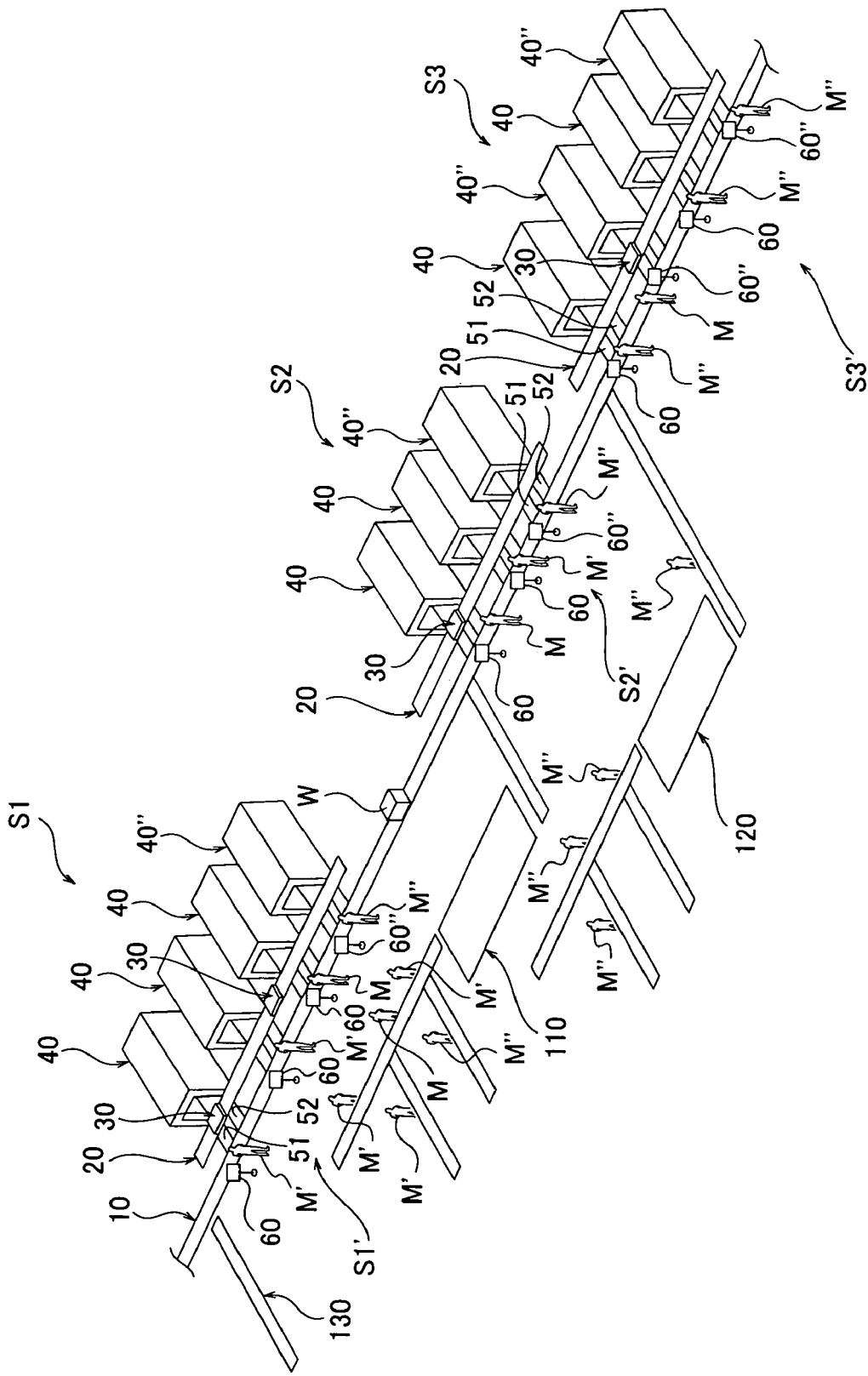
FIG. 8 is a perspective view showing a fourth embodiment of the production system according to the present invention.

FIG. 8 shows a fourth embodiment of the production system according to the present invention. To further increase the amount of production, automatic processing machines 40", display units 60", and sub-stations 120 and 130 are added to the production systems shown in FIG. 6 and FIG. 7. According to need, additional workers M" are stationed.

As described above, the manual work stations S1', S2', S3' (workers M, M', and M") are located on one side, whereas the automatic processing stations S1, S2, and S3 are located on the opposite side in the state in which the main conveying line 10 that can define a plurality of manual work areas A located between the manual work stations S1', S2', and S3' and the automatic processing stations S1, S2, and S3. Therefore, additional workers M" can be easily stationed, or automatic processing machines 40" can be easily added or changed when the amount of production is increased or when the type of the automatic processing machine 40 is changed.

Figure 9:
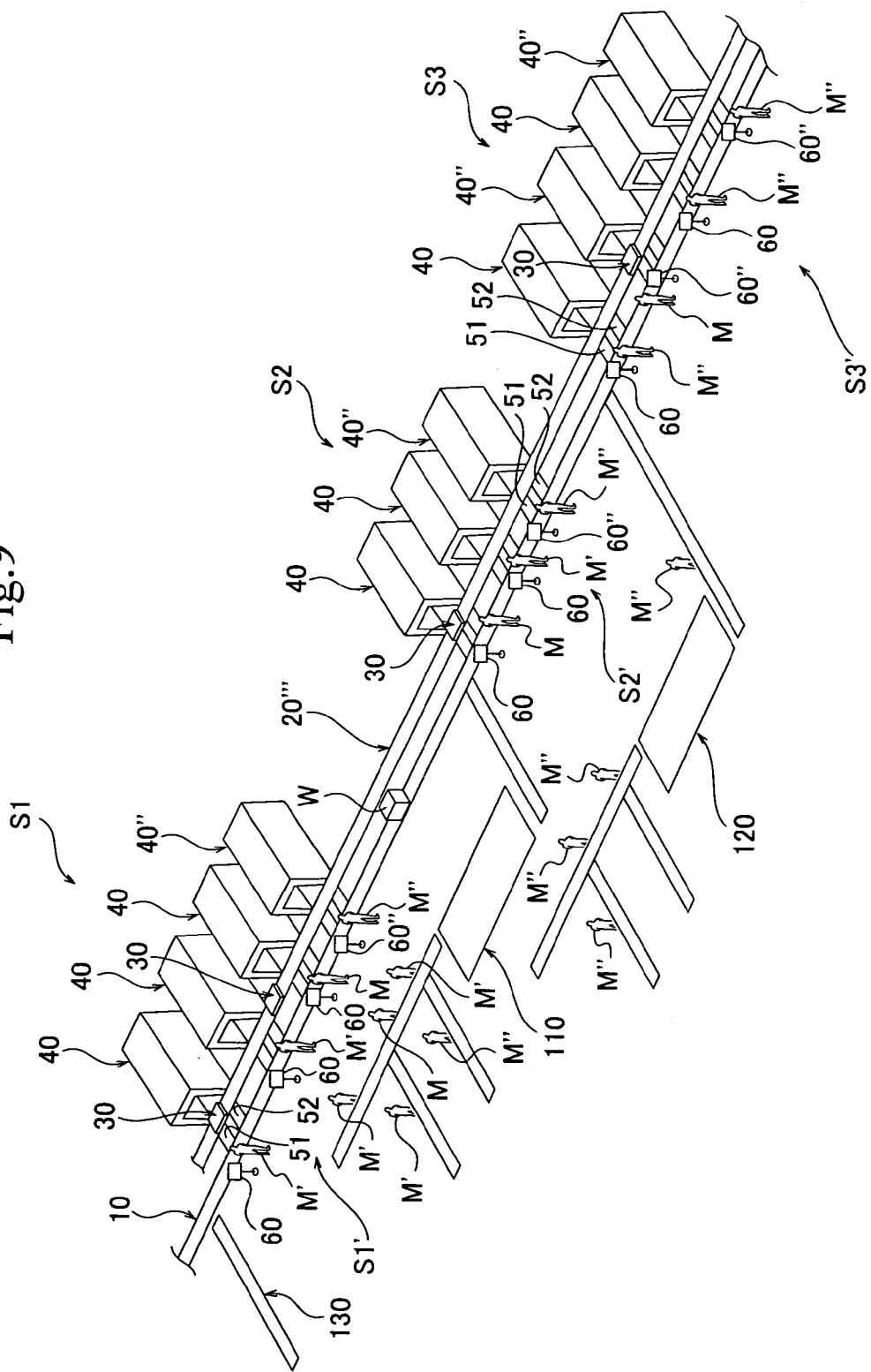
FIG. 9 is a perspective view showing a fifth embodiment of the production system according to the present invention.

FIG. 9 shows a fifth embodiment of the production system according to the present invention. In this embodiment, the shuttle conveying line 20 in the production system of FIG. 8 is changed.

In detail, in this production system, a single shuttle conveying line 20''' is disposed for all of the automatic processing stations S1, S2, and S3 located at a plurality of places. The single shuttle conveying line 20''' can be formed by connecting the shuttle conveying lines 20 mentioned in the above embodiment together.

According to this production system, when a workpiece W is transferred between the automatic processing station S1 (or S2) located on the upstream side and the automatic processing station S2 (or S3) located on the downstream side, the workpiece W can be directly transferred by using the shuttle conveying line 20''', i.e., by using the shuttle 30 without using the main conveying line 10. Therefore, the workpiece W can be more smoothly conveyed.

Figure 10:
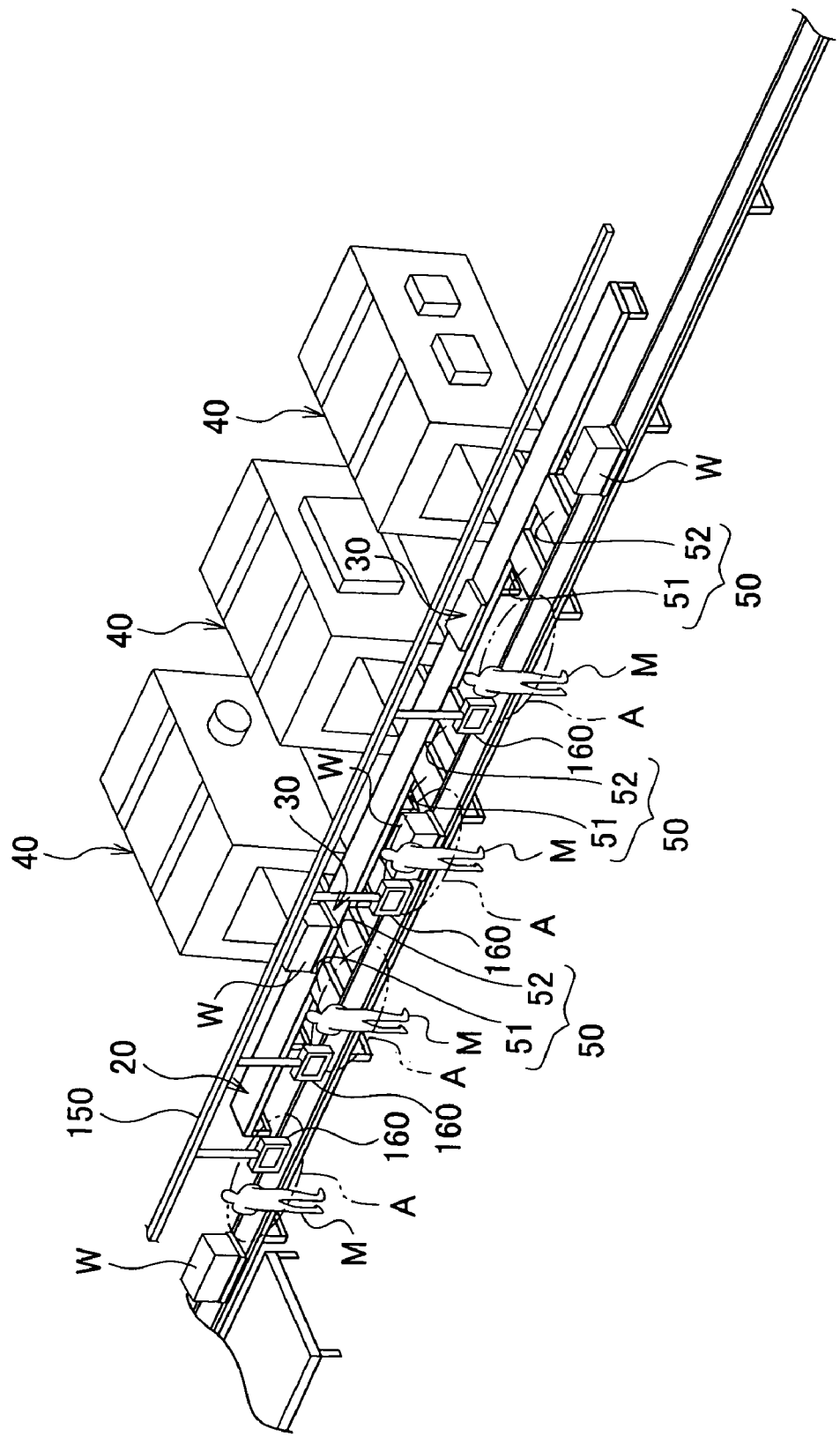
FIG. 10 is a perspective view showing a sixth embodiment of the production system according to the present invention.

FIG. 10 shows a sixth embodiment of the production system according to the present invention. In this embodiment, the arrangement of the display units is changed in comparison with the production system of FIG. 2.

In detail, in the production system according to this embodiment, a guide rail 150 serving as a guide member extending in a substantially horizontal direction is disposed along and above the main conveying line 10 as shown in FIG. 10. A plurality of display units 160 are hung from the guide rail 150 so as to be movable on the guide rail 150, and are fixed in corresponding manual work areas A, respectively.

Since the display unit 160 is hung from the guide rail 150 above the main conveying line 10, i.e., above the manual work area A in this way without being placed on, for example, the ground surface, a worker M can freely move so as to raise working efficiency without being subjected to restrictions on mobility that are caused by the display unit 160 acting also as an obstacle.

Figure 11:
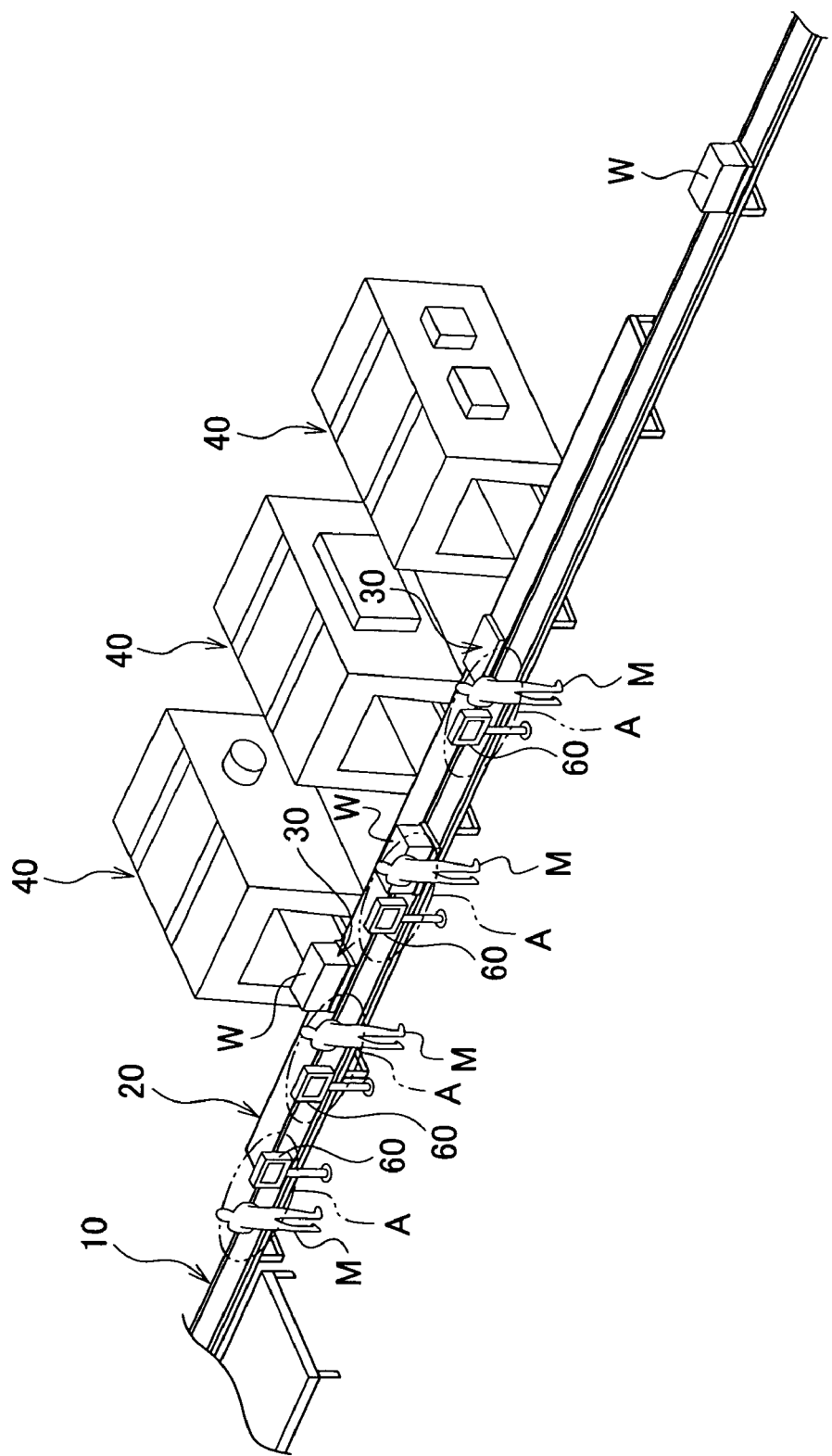
FIG. 11 is a perspective view showing a seventh embodiment of the production system according to the present invention.

FIG. 11 shows a seventh embodiment of the production system according to the present invention. The same reference characters are used to identify structure that is the same as the structure in the production system of FIG. 2, and a description of the same is omitted. In detail, in the production system according to this embodiment, the shuttle conveying line 20 is disposed adjacent to the main conveying line 10 as shown in FIG. 11, and the connection conveying line 50 (the connection carry-out line 51 and the connection carry-in line 52) shown in FIG. 2 is removed.

According to this production system, a workpiece W conveyed from the upstream side of the main conveying line 10 to the manual work area A is subjected to a predetermined manual process operation, and is transferred to the shuttle 30 by the manual work of a worker M. The shuttle 30 is then moved on the shuttle conveying line 20, so that the workpiece W is conveyed to a predetermined automatic processing machine 40.

When this automatic processing machine 40 completes an automated process operation, the workpiece W is again placed on the shuttle 30, and is transferred to the second manual work area A on the main conveying line 10. In the second manual work area A, a worker M performs a predetermined manual process operation while confirming process information on the display unit 60, and hands over the workpiece to the shuttle 30 again.

Thereafter, the shuttle 30 conveys the workpiece W to the same or another automatic processing machine 40. When the automatic processing machine 40 performs and completes another automated process operation, the workpiece W is again placed on the shuttle 30, and is transferred to the third manual work area A on the main conveying line 10.

Accordingly, the system can be simplified by removing the connection conveying line 50 mentioned above, and a series of manual process operations and automated process operations can be correlatively performed, thus achieving a rise in productivity. Although a burden imposed on the worker M is increased in accordance with the removal of the connection conveying line 50, this system is suitable especially for a case in which a relatively lightweight workpiece W is subjected to a series of process steps.

In the embodiments mentioned above, a description has been given of the production system in which an engine cylinder block or an engine cylinder head is used as a workpiece W. However, without being limited to this, the present invention can be applied to a production system in which other engine parts, pieces of electric equipment, etc., are used as workpieces W.

In the above embodiments, three or four automatic processing machines 40 and 40" are included in the automatic processing stations S1, S2, and S3. However, without being limited to this, five or more automatic processing machines 40 may be included therein in accordance with the contents of process operations.

In the above embodiments, an example is shown in which the three automatic processing stations S1, S2, and S3 are disposed for the single main conveying line 10. However, without being limited to this, four or more automatic processing stations and a plurality of corresponding manual work stations may be provided in accordance with a workpiece W to be subjected to process operations so that a series of automated process operations and manual process operations can be smoothly performed.

As described above, the production system of the present invention has manual process operations and automated process operations mixed together. According to this production system, the entire process can be smoothly performed, and an increase or decrease in the number of pieces of equipment or the replacement of the equipment can be easily achieved in response to an increase or decrease in the amount of production or a change in the machine model. Therefore, the present invention is, of course, applicable to a production system for use in the industrial fields of motor vehicles, electric equipment, etc., and is useful as a production system for use in other fields having a need to perform process operations while conveying workpieces.

What is claimed is:

1. A production system comprising:
   a single main conveying line capable of conveying workpieces, straightly extending a predetermined direction, and defining a plurality of manual work areas along a conveying direction thereof for allowing a worker to perform manual work on the workpieces from a first side of the main conveying line;
   a shuttle conveying line extending through a range corresponding to the plurality of manual work areas along the main conveying line, the shuttle conveying line being disposed along a second side of the main conveying line that is opposite the first side from which a worker performs manual work on the workpieces;
   a shuttle for holding a workpiece thereon, wherein the shuttle is movable in a reciprocating manner on the shuttle conveying line;
   a plurality of automatic processing machines that automatically apply a variety of process operations on the workpiece, the automatic processing machines being disposed along the shuttle conveying line on an opposite side relative to the main conveying line such that the shuttle conveying line is arranged between the automatic processing machines and the main conveying line and each of the automatic processing machines corresponds to one of the manual work areas; and
   a plurality of connection conveying lines respectively forming a connection between the main conveying line and the shuttle conveying line, the connection conveying lines being provided such that each of the connection conveying lines corresponds to one of the manual work areas.

2. The production system according to claim 1, further comprising a plurality of display units provided along the main conveying line, wherein the display units display information about a manual process operation that is applied to a workpiece.

3. The production system according to claim 2, wherein, when a faulty manual process operation is applied to a workpiece, the display units display information showing the faulty manual process operation.

4. The production system according to claim 2, wherein the automatic processing machines and the shuttle conveying line form a plurality of automatic processing stations along the main conveying line, and the manual work areas and the display units form a plurality of manual work stations along the main conveying line.

5. The production system according to claim 4, wherein the shuttle conveying line comprises a plurality of conveyors which are connected to each other.

6. The production system according to claim 2, wherein the display units are hung from a guide member provided along and above the main conveying line so that the display units can be moved with respect to the guide member.

7. The production system according to claim 2, wherein the display units are disposed such that each one of the display units corresponds to one of the manual work areas.

8. The production system according to claim 2, wherein each one of the display units corresponds to one of the manual work areas, respectively, and each of the display units includes an operating button for issuing a command such that, when a faulty manual process operation is performed in an upstream one of the manual work areas and is confirmed in a downstream one of the manual work areas, manipulation of the operating button of the display in the downstream manual work area causes the display in the upstream manual work area to display information showing the faulty manual process operation.

9. The production system according to claim 1, wherein the connection conveying lines respectively include a connection carry-out line extending from the main conveying line toward the shuttle conveying line and a connection carry-in line extending from the shuttle conveying line toward the main conveying line.

10. The production system according to claim 1, further comprising a control means for controlling workpiece processing, wherein, when a faulty manual process operation is performed on a workpiece in one of the manual work areas, the control means drive-controls the connection conveying lines and the shuttle so as to return the workpiece to the manual work area where the faulty manual process operation was performed.

11. The production system according to claim 1, wherein the automatic processing machines include an assembling mechanism capable of automatically applying at least one assembly process operation selected from a part attaching operation, a part detaching operation, a screw tightening operation, and a screw loosening operation onto an engine cylinder block or an engine cylinder head.

* * * * *